United States Patent
Zimmerman et al.

(10) Patent No.: US 9,582,085 B2
(45) Date of Patent: Feb. 28, 2017

(54) ELECTRONIC DEVICES WITH MOLDED INSULATOR AND VIA STRUCTURES

(71) Applicant: Apple Inc., Cupertino, CA (US)

(72) Inventors: Aidan N. Zimmerman, Sunnyvale, CA (US); Bruce E. Berg, Shanghai (CN); Glenn Aune, Seattle, WA (US); Kevin C. Armendariz, Mountain View, CA (US); Ryan P. Brooks, Menlo Park, CA (US)

(73) Assignee: Apple Inc., Cupertino, CA (US)

( * ) Notice: Subject to any disclaimer, the term of this patent is extended or adjusted under 35 U.S.C. 154(b) by 86 days.

(21) Appl. No.: 14/502,949

(22) Filed: Sep. 30, 2014

(65) Prior Publication Data

US 2016/0091991 A1    Mar. 31, 2016

(51) Int. Cl.
*G06F 3/0354* (2013.01)
*G06F 3/046* (2006.01)
(Continued)

(52) U.S. Cl.
CPC .......... *G06F 3/03545* (2013.01); *G06F 3/044* (2013.01); *H01Q 1/243* (2013.01); *H05K 3/284* (2013.01); *H05K 1/0274* (2013.01); *H05K 1/115* (2013.01); *H05K 3/0014* (2013.01); *H05K 3/4038* (2013.01); *H05K 2201/09027* (2013.01); *H05K 2201/09545* (2013.01)

(58) Field of Classification Search
CPC ................ G06F 3/03545; G06F 3/044; H05K 2203/1327; H05K 1/165; H05K 2201/09063; H05K 3/301; H05K 5/065; H05K 13/0046; H05K 1/11; H05K 1/111; H05K 1/119; H05K 1/186; H05K 2201/09118; H05K 2201/0999; H05K 3/0014; H05K 3/303; H05K 5/0034; H05K 7/02; H05K 1/0274; H05K 1/115; H05K 2201/09027; H05K 2201/09545; H05K 3/284; H05K 3/4038; H05K 1/113; H05K 5/006; Y10T 29/49002; Y10T 428/24917; Y10T 29/49087;
(Continued)

(56) References Cited

U.S. PATENT DOCUMENTS 6,204,457 B1 * 3/2001 Shekhel ............. G06F 3/03545
178/19.01
6,550,997 B1 * 4/2003 King ......................... B41J 3/36
178/79

(Continued)

*Primary Examiner* — Hong Zhou
(74) *Attorney, Agent, or Firm* — Treyz Law Group, P.C.; G. Victor Treyz; Zachary D. Hadd

(57) ABSTRACT

An electronic device may have printed circuits to which electrical components are mounted. Plastic may be molded over a printed circuit. Vias may be formed in the printed circuit that connect metal traces on the surface of the molded plastic to metal traces on the printed circuit. The vias may be formed by drilling or by covering the metal traces on the printed circuit with mold pins in a molding tool during plastic molding operations. Plated metal traces or other metal traces may extend onto the interior surface of via holes. Vias may also be filled with conductive material such as solder or conductive adhesive. Metal members that are soldered or otherwise connected to printed circuit traces may be used in coupling surface metal traces to printed circuit traces. Antenna structure, shielding structures, and electrodes for a stylus may be formed using the metal traces on the molded plastic.

20 Claims, 15 Drawing Sheets

(51) Int. Cl.
*H01Q 1/24* (2006.01)
*H05K 1/02* (2006.01)
*H05K 1/03* (2006.01)
*H05K 1/11* (2006.01)
*H05K 3/00* (2006.01)
*H05K 3/40* (2006.01)
*G06F 3/044* (2006.01)
*H05K 3/28* (2006.01)

(58) Field of Classification Search
CPC ........... Y10T 29/49124; Y10T 29/4913; Y10T 29/49172; H01Q 1/243
USPC ......... 345/173–190; 178/19.01, 19.03, 19.05
See application file for complete search history.

(56) References Cited

U.S. PATENT DOCUMENTS

| | | | |
|---|---|---|---|
| 7,777,351 B1* | 8/2010 | Berry | H01L 23/3128 257/778 |
| 8,698,323 B2 | 4/2014 | Mohammed et al. | |
| 8,723,308 B2 | 5/2014 | Yang et al. | |
| 2006/0172533 A1* | 8/2006 | Sun | H05K 3/465 438/675 |
| 2008/0017968 A1* | 1/2008 | Choi | H01L 21/565 257/686 |
| 2009/0093136 A1* | 4/2009 | Hiew | G06F 1/1632 439/55 |
| 2013/0237162 A1* | 9/2013 | Yoon | H01Q 5/328 455/77 |
| 2013/0301230 A1 | 11/2013 | Aoyama et al. | |
| 2013/0308787 A1* | 11/2013 | Stanley | H01H 9/0228 381/74 |
| 2014/0028518 A1* | 1/2014 | Arnold | H01Q 1/526 343/841 |
| 2014/0048310 A1* | 2/2014 | Montevirgen | H05K 1/14 174/250 |
| 2014/0072151 A1 | 3/2014 | Ochs et al. | |
| 2014/0140018 A1 | 5/2014 | Malek et al. | |
| 2014/0177181 A1* | 6/2014 | Malek | H05K 9/003 361/749 |
| 2015/0138165 A1* | 5/2015 | Hinson | G06F 3/0383 345/179 |

* cited by examiner

ELECTRONIC DEVICES WITH MOLDED INSULATOR AND VIA STRUCTURES

BACKGROUND

This relates generally to electronic devices, and, more particularly, to interconnecting printed circuits and metal traces to form conductive structures for electronic devices.

Electronic devices include electronic components such as integrated circuits, sensors, and other circuitry. Electronic components may be mounted on printed circuit boards. Printed circuits may also be used to form signal cables. In some scenarios, it may be desirable to form conductive structures using metal traces on printed circuits. For example, electrodes, shields, antennas, and other metal structures may be formed using metal traces. Vias may be used to interconnect traces on different printed circuit board layers.

If care is not taken, the conductive structures will not be well integrated with other device structures, electrical connections will not be reliable, and the shapes and locations of metal traces relative to other conductive structures will be poorly defined.

It would therefore be desirable to be able to provide improved techniques for forming conductive structures for electronic devices.

SUMMARY

An electronic device may have printed circuits to which electrical components are mounted. Plastic may be molded over a printed circuit. Vias may be formed in the printed circuit to connect metal traces on the surface of the molded plastic to metal traces on the printed circuit. The metal traces on the surface of the molded plastic may be used in forming antenna structures, shielding structures, electrodes for an active computer stylus, or other conductive structures.

The vias may be formed by drilling or by covering the metal traces on the printed circuit with mold pins in a molding tool during plastic molding operations. Plated metal traces or other metal traces may extend along the interior surfaces of via holes. Vias may also be filled with conductive material such as solder or conductive adhesive. Metal members that are soldered or otherwise connected to printed circuit traces may be used in coupling surface metal traces to printed circuit traces.

DETAILED DESCRIPTION

An electronic device may include conductive structures that are supported by printed circuits and dielectric structures such as molded plastic structures. The conductive structures may form electrodes, signal paths for interconnecting electrical components, electromagnetic shielding structures, antenna structures, or other conductive device structures.

Figure 1:
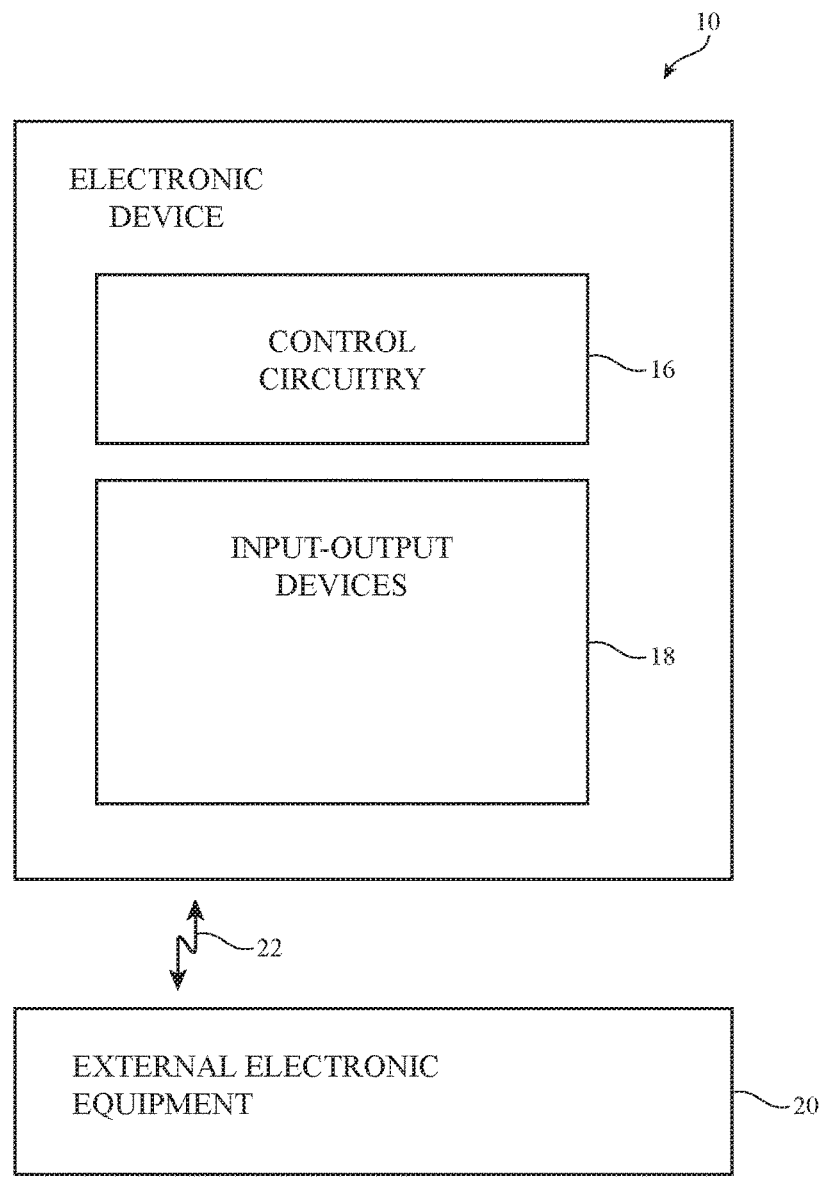
FIG. 1 is a schematic diagram of an illustrative electronic device and associated electronic equipment in accordance with an embodiment.

An illustrative electronic device of the type that may include conductive structures such as these is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, stylus that is used in supplying drawing or writing input to a touch pad or a touch screen display, equipment that implements the functionality of two or more of these devices, or other electronic equipment.

Electronic device may interact with external equipment 20. Equipment 20 may be a device such as device 10, a tablet computer or other device with a touch screen display, a touch pad, or other external electronic equipment. Signals may be conveyed wirelessly between device 10 and equipment 20 during operation, as shown by wireless signals 22. Wireless signals 22 may include near-field wireless signals. For example, near-field electromagnetic coupling such as capacitive or inductive near-field coupling may allow signals in device 10 to be conveyed to equipment 20. If, for example, device 10 is an active computer stylus and equipment 20 has a touch sensor (e.g., a touch sensor that forms part of a touch pad or a touch sensor that forms part of a touch screen display), device 10 may use electrodes in device 10 to convey signals to equipment 20 that equipment 20 captures and uses as writing input. Wireless signals 22 may also include radio-frequency signals that form part of a local wireless area network such as Bluetooth® signals, IEEE 802.11 (WiFi®) signals, or other wireless signals.

As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors and other wireless communications circuits, power management units, audio chips, application specific integrated circuits, etc.

Input-output circuitry in device 10 such as input-output devices 18 may be used to allow data to be supplied to device 10 and to allow data to be provided from device 10 to external devices. Input-output devices 18 may include buttons, joysticks, scrolling wheels, touch pads, key pads, keyboards, microphones, speakers, tone generators, vibrators, cameras, sensors such as touch sensors, proximity sensors, ambient light sensors, compasses, gyroscopes, accelerometers, light-emitting diodes and other status indicators, data ports, etc. A user can control the operation of device 10 by supplying commands through input-output devices 18 and may receive status information and other output from device 10 using the output resources of input-output devices 18.

Input-output devices 18 may include one or more displays. Device 10 may, for example, include a touch screen display that includes a touch sensor for gathering touch input from a user or a display that is insensitive to touch. Stand-alone touch sensors for device 10 may also be provided (e.g., in configurations in which device 10 does not include a display or in which both a touch screen display and a stand-alone sensor are desired). A touch sensor for device 10 may be based on an array of capacitive touch sensor electrodes, acoustic touch sensor structures, resistive touch components, force-based touch sensor structures, a light-based touch sensor, or other suitable touch sensor arrangements.

Power for device 10 may be provided by an external source of power and/or an internal battery. The components for device 10 such as circuitry 16 and devices 18 and other structures in device 10 may be implemented using integrated circuits, discrete components (e.g., resistors, capacitors, and inductors), microelectromechanical systems (MEMS) devices, portions of housing structures, packaged parts, and other devices and structures.

Control circuitry 16 may be used to run software on device 10 such as operating system code and applications. During operation of device 10, the software running on control circuitry 16 may display images for a user on one or more displays and may use other internal components such as input-output devices 18. Device 10 may use communications circuits to send and receive wireless and wired data. For example, device 10 may use light-emitting components to transmit data and may use light-receiving components to receive transmitted light signals. Device 10 may also use light-emitting components, light-receiving components, audio components, capacitive sensors, microelectromechanical systems devices, and other components as sensors and output devices. Device 10 may use wireless circuits in circuitry 16 (e.g., a baseband processor and associated radio-frequency transceiver circuitry, near-field communications circuits, or other circuitry that emits and/or receives electromagnetic signals) to transmit and receive wireless signals. For example, device 10 may transmit and receive cellular telephone signals, wireless local area network signals, near-field electromagnetic signals, or other wireless data.

Figure 2:
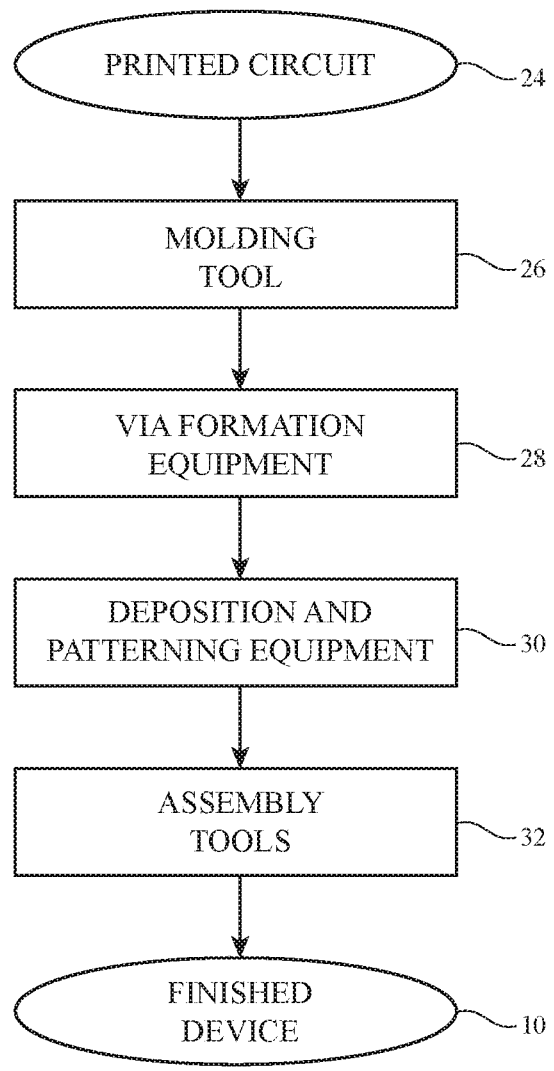
FIG. 2 is a diagram of equipment that may be used in forming an electronic device in accordance with an embodiment.

FIG. 2 is a diagram showing illustrative equipment of the type that may be used processing printed circuits and other structures to form electronic device 10. As shown in FIG. 2, device 10 may be formed using one or more printed circuits such as printed circuit 24. In an assembled device, circuitry can be mounted to printed circuit 24. Printed circuit 24 may be a rigid printed circuit board (e.g., a printed circuit board formed from fiberglass-filled epoxy or other rigid printed circuit board material) or may be a flexible printed circuit (e.g., a printed circuit formed from a sheet of polyimide or other flexible polymer layer). Patterned metal traces within printed circuit 24 and additional conductive structures in device 10 may be used to form signals paths that interconnect integrated circuits and other components, electromagnetic shielding, antenna structures, electrodes for sensing or for emitting electromagnetic fields (e.g., near-field electromagnetic signals), and other device structures.

If desired, conductive structures such as these may be supported using substrates other than printed circuit 24. For example, metal traces may be supported on dielectric materials such as glass, ceramic, sapphire or other crystalline dielectric materials, or plastic. Configurations in which device 10 contains conductive structures that are supported partly by one or more printed circuits and partly by other dielectric material such as plastic are sometimes described herein as an example. This is, however, merely illustrative. In general, conductive structures for device 10 may be supported using any suitable insulating support structures.

Plastic support structures for the conductive structures of device 10 may be shaped using cutting tools, machining tools, laser-based tools for drilling and cutting, water-jet cutting equipment, plasma cutting equipment, sanding and grinding equipment, and other equipment for forming plastic into desired shapes. With one suitable arrangement, which may sometimes be described herein as an example, one or more plastic support structures in device 10 are formed using plastic molding techniques (e.g., injection molding or other molding techniques).

Plastic may be molded onto or around some or all of printed circuit 24 using molding equipment such as molding tool 26 of FIG. 2. For example, one or more printed circuits such as printed circuit 24 may be inserted into a mold cavity. Molten plastic may then be injected into the cavity. As the plastic is injected into the cavity, the plastic comes into contact with printed circuit 24. Depending on the shape of the mold cavity, the molded plastic may cover some or all of printed circuit 24. Printed circuit 24 may, for example, be embedded completely within the molded plastic or may be partly embedded within the molded plastic. Plastic may also be molded onto one or more surfaces of printed circuit 24 (e.g., part of an upper surface, part of a rear surface and/or part of one or more edges of printed circuit 24).

The outermost surfaces of the molded plastic may serve to support metal traces. These metal traces may be interconnected with metal traces in the printed circuit using vias. Vias may be formed as part of the molding process (e.g., using mold pins in tool 26) or may be formed after the plastic has been molded onto printed circuit 24 using via formation equipment 28. Via formation equipment 28 may including machining equipment such as mechanical drills or punches, may include laser-based equipment (e.g., laser drilling equipment), may include etching equipment (e.g., plasma etching equipment), or may include other tools for forming openings through plastic. Via structures may be used to interconnect metal structures that are located on the surface of the plastic that is molded to printed circuit 24 using molding tool 26 with underlying metal structures such as metal pads and other metal traces in printed circuit 24.

After vias have been formed through the plastic (e.g., after mold pins have been used to create openings in the plastic during the molding operations with molding tool 26 and/or after laser-drilling or mechanical drilling equipment 28 has been used to form vias), deposition and patterning equipment 30 may be used to form conductive structures. Deposition and patterning equipment 30 may include equipment for depositing blanket metal films, equipment for depositing metal through shadow masks, equipment for locally depositing conductive materials (e.g., conductive paint deposition equipment such as screen printing equipment, pad printing equipment, and ink-jet printing equipment), soldering equipment, equipment for depositing solder paste (e.g., screen printing equipment, etc.) and reflowing the solder paste (e.g., an oven, laser, hot-bar or other heat source), equipment for etching deposited films, equipment for forming welds, equipment for applying conductive materials using spraying, needle dispenser equipment, electroplating equipment (e.g., equipment for selectively plating metal onto portions of a plastic structure that have been activated by localized exposure to laser light or that have been subjected to other activation processes such as mechanical activation processes), or other equipment for depositing and patterning conductive structures. The conductive structures may, as an example, include metal traces that run down the sides of vias in the molded plastic and may include solder or other conductive material that is used as a conductive filler in the vias (i.e., material that is placed within the vias on top of the metal traces in the vias).

Following formation of printed circuit structures with overmolded plastic and conductive structures that are interconnected using vias, assembly tools 32 may be used to complete the assembly of some or all of device 10. Tools 32 may include manually controlled equipment and/or automated equipment that mounts the printed circuit and plastic structures in a housing for device 10 and that incorporates other electrical components into the housing for device 10 (e.g., control circuitry 16 and input-output devices 18 of FIG. 1). Assembly tools 32 may be used in forming a completed electronic device 10 or part of an electronic device. The equipment of FIG. 2 may be used to mount electrical components onto printed circuit 24 before and/or after molding plastic onto printed circuit 24 with tool 26. Electrical components such as integrated circuits, sensors, switches, and other circuitry may, for example, be soldered onto printed circuit 24 before printed circuit 24 is inserted into molding tool 26 and/or after via formation have been performed using equipment such as equipment 26, 28, and/or 30. For example, components may be soldered onto printed circuit 24 using assembly tools 32 after vias have been formed using tools 26, 28, and/or 30 by using soldering equipment in tools 32.

Figure 3:
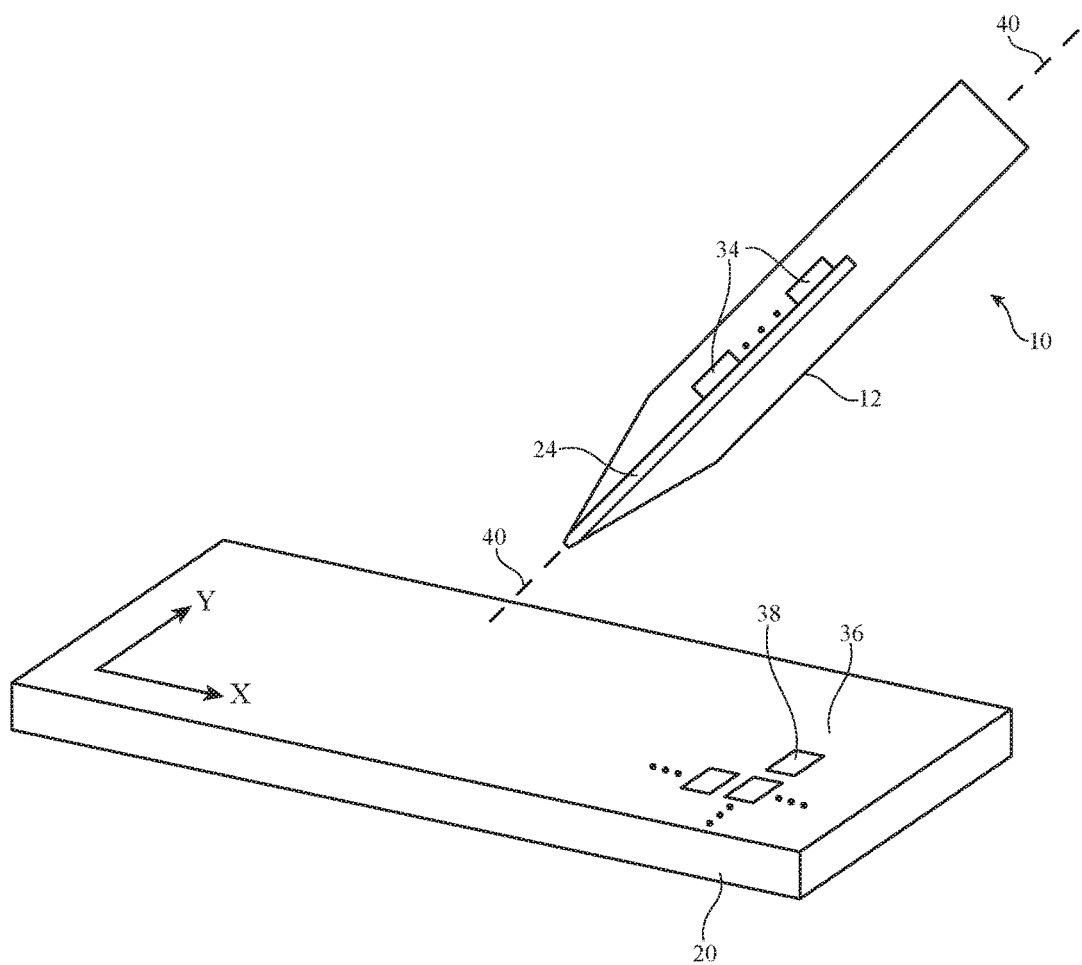
FIG. 3 is a perspective view of an illustrative stylus interacting with external equipment such as a touch pad or tablet computer in accordance with an embodiment.

As shown in FIG. 3, device 10 may be an electronic device such as a computer stylus (pen). Stylus 10 may be an active stylus that emits alternating current near-field electromagnetic signals from its tip that are detected by electrodes 38 on surface 36 of external equipment 20. Equipment 20 may be, for example, a tablet computer or a touch pad. Electrodes 38 may be organized in an array or other pattern on surface 36 of equipment 20. Electrodes 38 may be capacitive sensor electrodes that forms a touch sensor array (e.g., a capacitive touch sensor for a touch screen display in a tablet computer or a capacitive touch sensor array for a touch pad or other device without an overlapping display). The touch sensor formed from electrodes 38 may monitor the signals emitted by stylus 10 and may process this information to determine the location of the tip of stylus 10 in lateral dimensions X and Y. This allows stylus 10 to be used to draw lines and provide other stylus input during use of equipment 20.

Stylus 36 may have a housing such as housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.). Device 10 may have inner housing structures that provide additional structural support to device 10 and/or that serve as mounting platforms for printed circuits and other structures. Structural internal housing members may sometimes be referred to as housing structures and may be considered to form part of housing 12.

Device 10 and housing 12 may have an elongated shape such as an elongated cylindrical shape or other elongated shape that facilitates handheld operation by a user. Device 10 and housing 12 may, for example, have an elongated shape that extends along longitudinal axis 40. Printed circuit 24 may have an elongated shape that extends along axis 40 within housing 12. Electrical components 34 may be mounted on printed circuit 24 (e.g., components such as integrated circuits, discrete components such as inductors, resistors, and capacitors, sensors, switches, connectors, and other circuitry). Plastic may be molded around printed circuit 24 and/or around some or all of components 34 using molding tool 26, as described in connection with FIG. 2.

Figure 4:
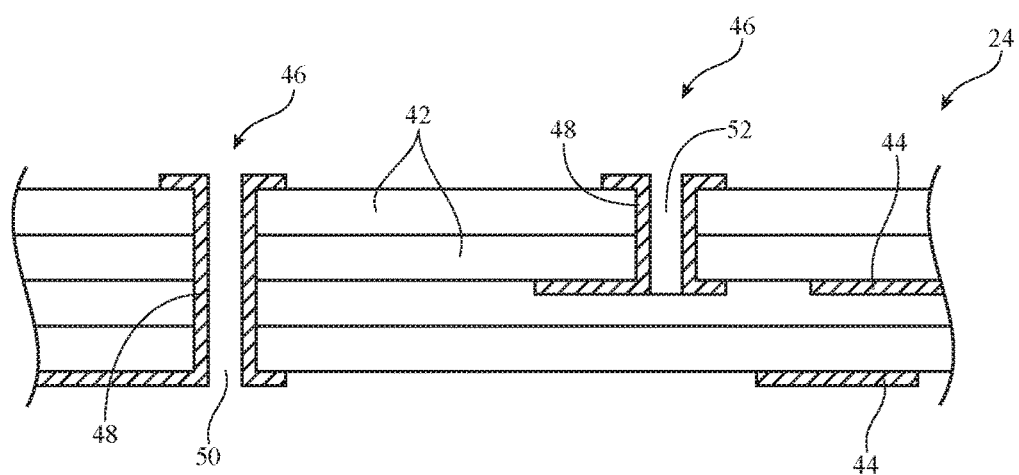
FIG. 4 is a cross-sectional side view of an illustrative printed circuit in accordance with an embodiment.

A cross-sectional side view of an illustrative printed circuit of the type that may be used in device 10 is shown in FIG. 4. As shown in FIG. 4, printed circuit 24 may have one or more dielectric layers 42 (e.g., layers of fiberglass-filled epoxy or other rigid printed circuit board material, layers of polyimide or other flexible sheets of polymer in a flexible printed circuit, etc.). One or more patterned layers of metal may form metal traces 44 and may be supported by dielectric layers 42. Metal traces 44 may be formed from metals such as copper or other metals. Vias 46 may be formed using openings such as opening 50 and opening 52. Metal traces in the interior of vias 46 such as metal 48 may be used in forming conductive via sidewalls. Conductive materials may also be placed in openings 50 and 52 (e.g., solder, conductive adhesive, etc.).

Vias 46 may include through vias (vias that pass through printed circuit 24) using through-holes such as opening 50. Vias 46 may also include blind vias (vias that pass partway through circuit 24) using openings such as opening 52 that pass through some but not all of the layers 42 in printed circuit 24.

Figure 5:
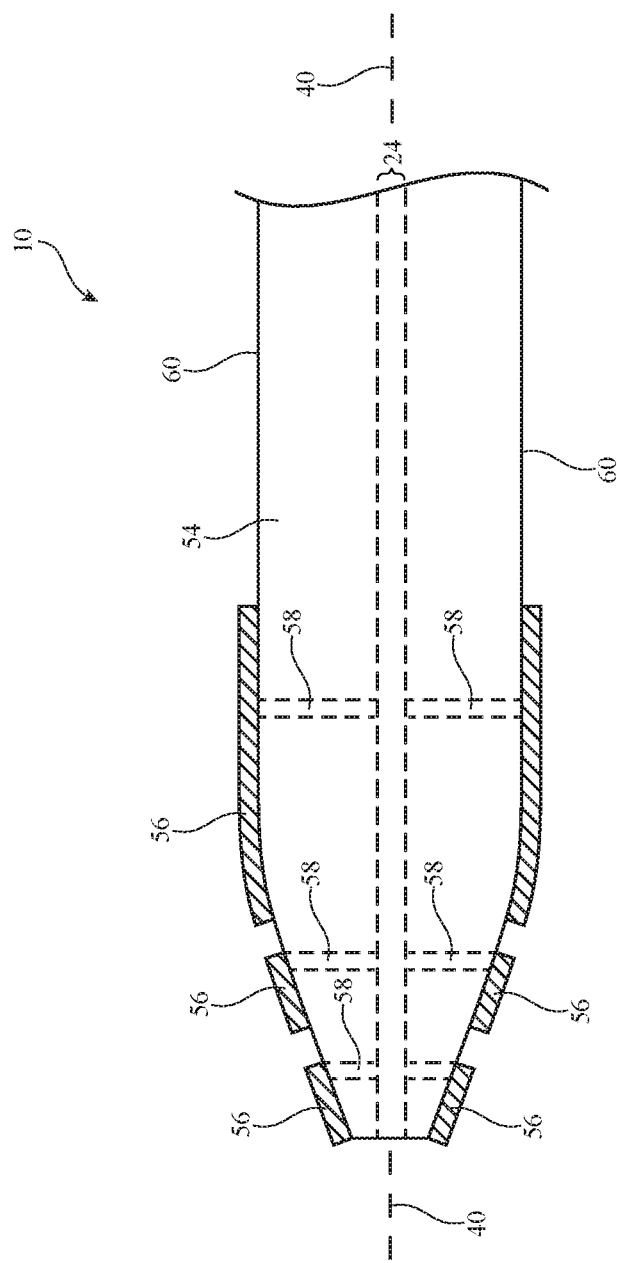
FIG. 5 is a cross-sectional side view of an illustrative printed circuit covered with molded plastic in accordance with an embodiment.

If desired, vias may be formed in molded plastic structures in addition to or instead of passing through printed circuit 24. Consider, as an example, the structures of FIG. 5. In the example of FIG. 5, plastic 54 has been molded over printed circuit 24. Plastic 54 may, as an example, have a molded shape that allows plastic 54 to be accommodated within the tip of a stylus housing. For example, plastic 54 may have a cylindrical shape with a tapered tip (see, e.g., the left side of plastic 54 of FIG. 5). Vias 58 may be formed in plastic 54. Vias 58 may extend between metal traces 56 on outer surface 60 of plastic 54 and printed circuit 24. Metal traces 56 may have ring shapes (circumferential shapes) that extend around the circumference of plastic 54 (i.e., traces 56 may form ring-shape circumferential electrodes that encircle longitudinal axis 40 of FIG. 5).

If desired, vias 58 may have portions (see, e.g., through via 46 of FIG. 4) that pass through printed circuit 24. Vias 58 may also be configured to terminate at the upper and/or lower surfaces of printed circuit 24 (e.g., on metal traces that form contact pads on printed circuit 24). Metal traces 56 may be formed by selectively exposing portions of the surface of plastic 54 to laser light or applying other surface treatment to activate these portions. Metal plating operations may then be formed to produce metal traces. During plating operations, metal traces 56 will only be formed in the portions of plastic 54 that have been selectively activated. If desired, other types of conductive material may be used to form conductive structures 56 (e.g., conductive paint, solder, metal foil, etc.). The use of laser-based metal deposition processes is merely illustrative.

The interior surfaces of vias 58 may be coated with metal traces (see, e.g., metal traces 48 in vias 46 of FIG. 4). The metal traces in vias 58 may be formed using laser activation and metal plating, may be formed using physical vapor deposition techniques, or may be formed using other techniques. Solder, conductive adhesive, or other conductive material may be deposited in the interior of vias 58 (e.g., on top of the metal traces in vias 58). The presence of the conductive material may help strengthen the vias and increase the conductivity of the vias.

Figure 6:
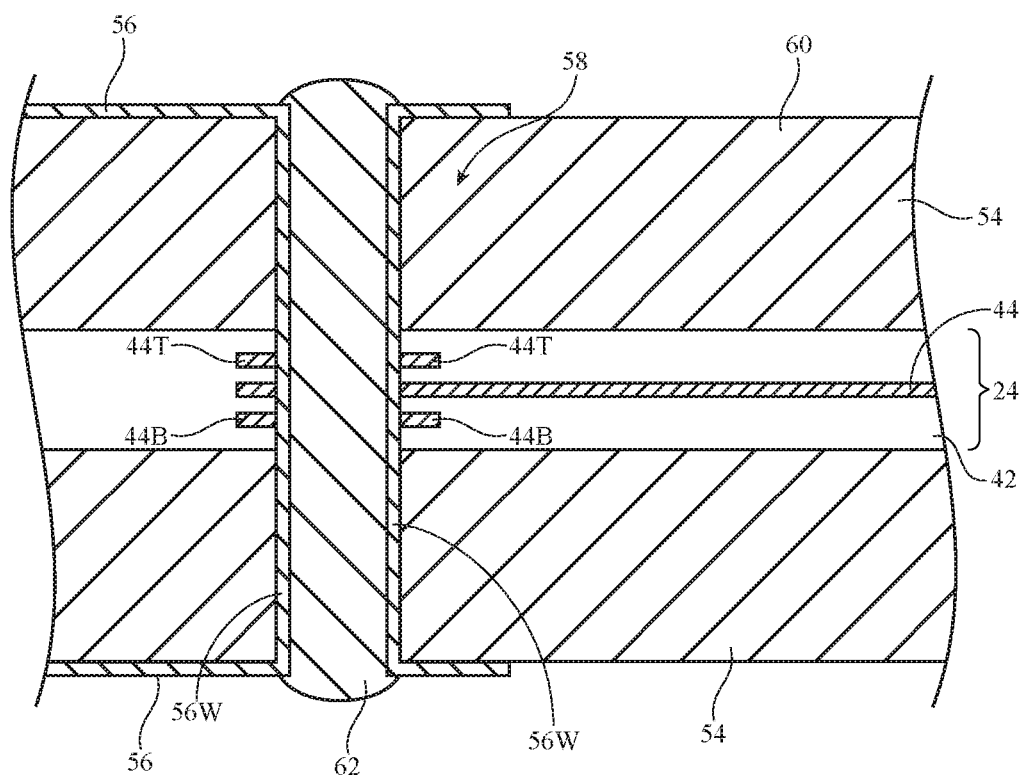
FIG. 6 is a cross-sectional side view of an illustrative through via structure in accordance with an embodiment.

FIG. 6 is a cross-sectional side view of an illustrative via formed through plastic 54. As shown in FIG. 6, via 58 may have an inner surface coated with metal traces 56W (e.g., plated metal traces or metal traces formed using other techniques). Metal traces 44 in printed circuit 24 may be shorted to metal trace 56W. Metal traces such as metal traces 44T and 44B may have circular footprints (when viewed along the axis of via 58) and may surround via 58 to provide additional connections to metal traces 56T.

Conductive material 62 may fill via 58. The presence of conductive material 62 may help strengthen via 58 and may provide additional conductivity to via 58. Conductive material 62 may be formed from solder, conductive adhesive, plated metal, wire, conductive paint, or other conductive material. Via 58 electrically connects surface traces 56 on outer surface 60 of plastic 54 to metal traces 44 in printed circuit 24.

Figure 7:
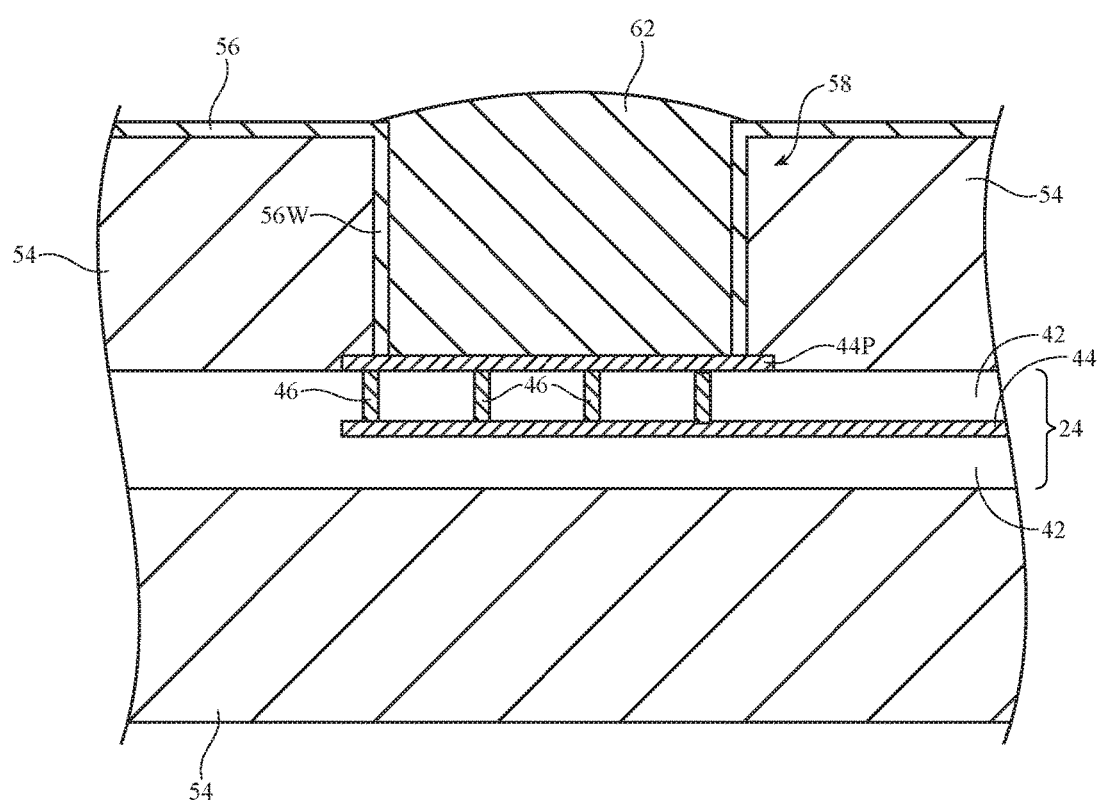
FIG. 7 is cross-sectional side view of an illustrative via structure that terminates on a printed circuit board pad in accordance with an embodiment.

In the example of FIG. 6, via 58 passes through plastic 54 and through printed circuit 24. FIG. 7 is a cross-sectional side view of plastic 54 and printed circuit 24 in a scenario in which via 58 terminates on a contact pad on the surface of printed circuit 24. As shown in FIG. 7, printed circuit 24 may have inner metal traces 44 that are coupled by vias 46 to surface trace 44P. Surface metal trace 44P lies on the upper surface of printed circuit 24 (in the example of FIG. 7) and forms a metal pad. Metal pad 44P may be covered by some of metal traces 56W during plating operations or other metal coating operations (e.g., when coating the interior of via 58 with metal 56W) or may be left uncovered by metal 56W. Conductive material 62 fills via 58 and is electrically connected to contact pad 44P. With this arrangement, printed circuit traces 44 are coupled to surface traces 56 on plastic 54 through the conductive structures of via 58.

Figure 8:
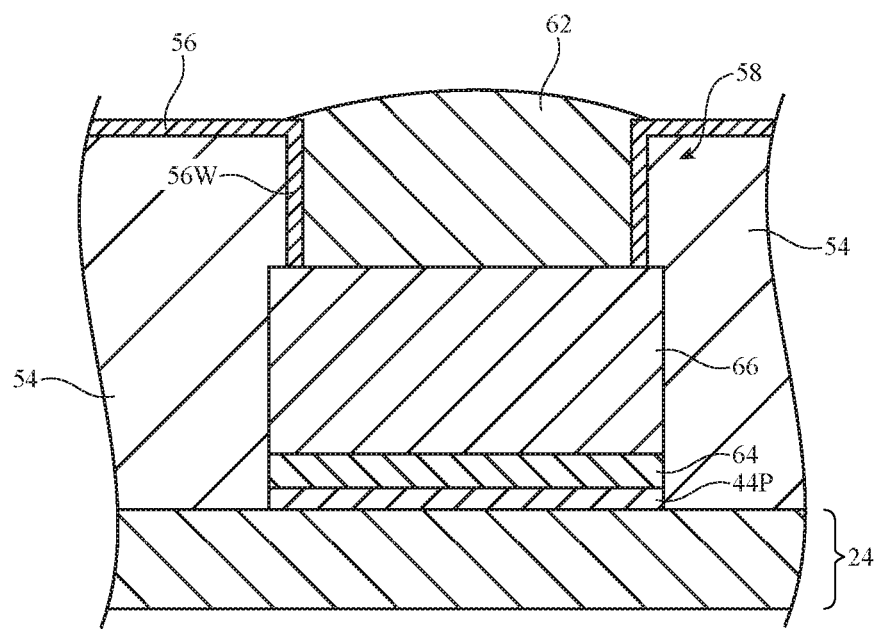
FIG. 8 is a cross-sectional side view of an illustrative via structure that terminates on a metal structure such as a standoff that has been soldered to a printed circuit board pad in accordance with an embodiment.

If desired, a metal structure such as metal structure 66 may be soldered to contact pad 44P, as shown in FIG. 8. Metal structure 66 may be a copper member or other metal member (sometimes referred to as a standoff). Solder 64 or other conductive material may be used to couple structure 66 to pad 44P. Metal coating 56W on the inner surface of via 58 may cover the upper portion of metal structure 66 or metal structure 66 may be uncovered by coating 56W. Solder 62 or other conductive material may fill via 58 to short metal trace 56 on the surface of plastic 54 to metal traces in printed circuit 24.

Figure 9:
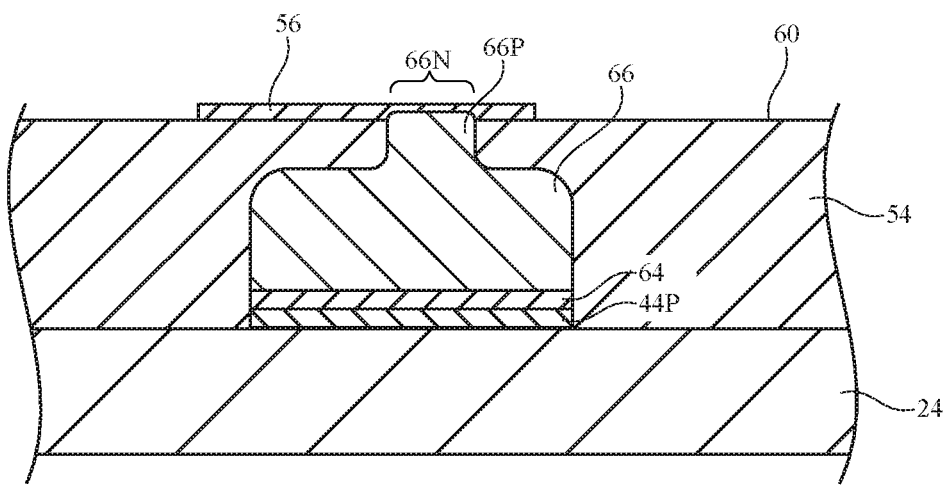
FIG. 9 is a cross-sectional side view of an illustrative metal structure that forms an electrical connection through molded plastic in accordance with an embodiment.

In the illustrative configuration of FIG. 9, metal structure 66 has a portion such as portion 66P that is sufficiently tall to penetrate through the upper surface 60 of plastic 54. Metal structure 66 is mounted to printed circuit board 24 (e.g., by using conductive material 64 such as solder or conductive adhesive to attach metal member 66 to pad 44P). During molding, surface 66N of portion 66P of metal structure 66 may be protected by a portion of the mold so that surface 66N remains uncovered by plastic 54. This allows metal trace 56 on surface 60 of plastic 54 to electrically contact metal structure 66 and thereby become electrically connected to metal trace 44P on printed circuit 24. With arrangements of the type shown in FIG. 9, no vias holes need be filled with metal traces and solder, because electrical connections are made through metal structure 66.

Figure 10:
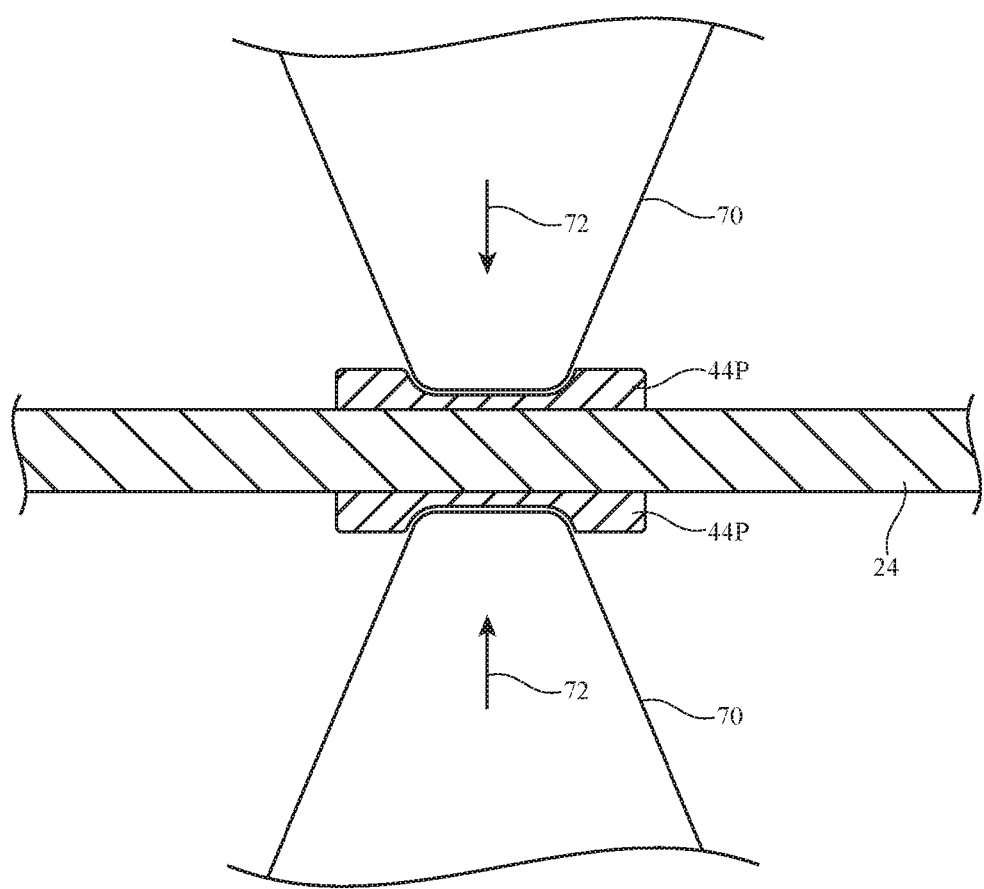
FIG. 10 is a cross-sectional side view of a printed circuit with pads that are being contacted and deformed by mold pins in accordance with an embodiment.

Vias 58 may be formed using mold pins in molding tool 26. An illustrative configuration is shown in FIG. 10. In the side view of FIG. 10, pads 44P on printed circuit 24 are being compressed between opposing mold pins 70. Mold pins 70 form part of molding tool 26 and are moved towards each other in directions 72 before plastic is injected into the mold cavity of tool 26. As shown in FIG. 10, the tips of mold pins 70 may compress pads 44P sufficiently to form slight indentations in pads 44P, thereby helping to seal off pads 44P from molten plastic. This ensures that plastic 54 will not cover these surface portions of pads 44P during molding. During subsequent via formation operations, the absence of plastic over pads 44P will ensure that metal traces and other conductive material (e.g., solder, conductive adhesive, etc.) will form satisfactory electrical contact to pads 44P.

An illustrative approach for forming vias 58 using mold pins 70 is shown in FIGS. 11, 12, 13, and 14.

Figure 11:
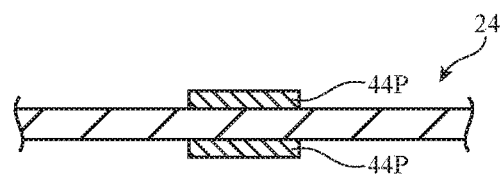
FIG. 11 is a cross-sectional side view of a printed circuit with metal pads in accordance with an embodiment.
Figure 12:
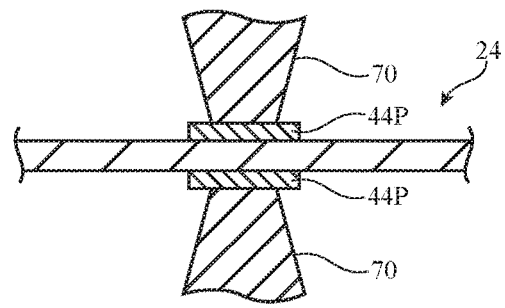
FIG. 12 is a cross-sectional side view of a printed circuit of the type shown in FIG. 11 being compressed between a pair of mold pins in accordance with an embodiment.
Figure 13:
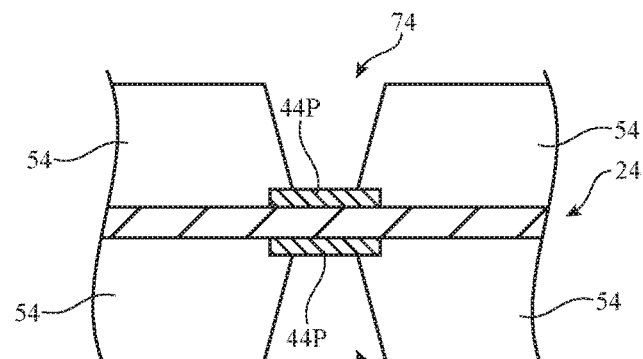
FIG. 13 is a cross-sectional side view of the printed circuit of FIG. 12 following injection molding of a layer of plastic over the printed circuit and removal of the mold pins in accordance with an embodiment.

Initially, metal traces are formed on printed circuit 24. The metal traces may include contact pads 44P, as shown in FIG. 11. Two pads 44P on opposing surfaces of printed circuit 24 are shown in the example of FIG. 11. In general, there may be any suitable number of pads 44P (e.g., one or more, two or more, four or more, ten or more, fewer than 20, etc.). Pads 44P may be formed on one side of printed circuit 24 or may be formed on opposing sides of printed circuit 24. When aligned as shown in FIG. 11, the overlapping nature of pads 44P allows mold pins to simultaneously press inwards in opposing directions without deflecting printed circuit 24, as described in connection with FIG. 10 (see, e.g., FIG. 12 in which mold pins 70 have been used to cover portions of pads 44P on the upper and lower surfaces of printed circuit 24).

After covering the surfaces of pads 44P using one or more mold pins in molding tool 26, plastic 54 may be molded in the interior of molding tool 26 (e.g., in a mold cavity that surrounds printed circuit 24 and mold pins 70). Once the plastic has cooled and set, the mold die may be removed and pins 70 may be pulled away from plastic 54 to reveal openings such as holes 74 of FIG. 13. Openings 74 may terminate at the exposed surfaces of pads 44P in printed circuit 24.

Figure 14:
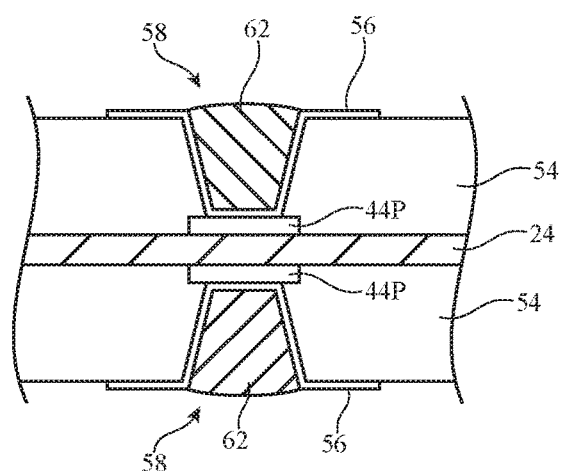
FIG. 14 is a cross-sectional side view of the printed circuit of FIG. 13 following formation of conductive via structures in accordance with an embodiment.

Electrical connections may be formed for vias 58 by incorporating one or more conductive materials into openings 74. As shown in FIG. 14, for example, metal traces 56 may have portions that extend along the interior surfaces of openings 74 and that cover pads 44P (as in the example of FIG. 14) or that leave pads 44P bare. Metal traces 56 may be deposited using physical vapor deposition, plating (e.g., plating following selective laser activation of portions of the surface inside openings 74 and on outer surface 60 of plastic 54), or using other suitable deposition techniques. If desired, conductive material 62 may be deposited on top of metal traces 56 in opening 74 to fill via 58 (e.g., in situations in which traces 56 do not completely fill openings 74).

Figure 15:
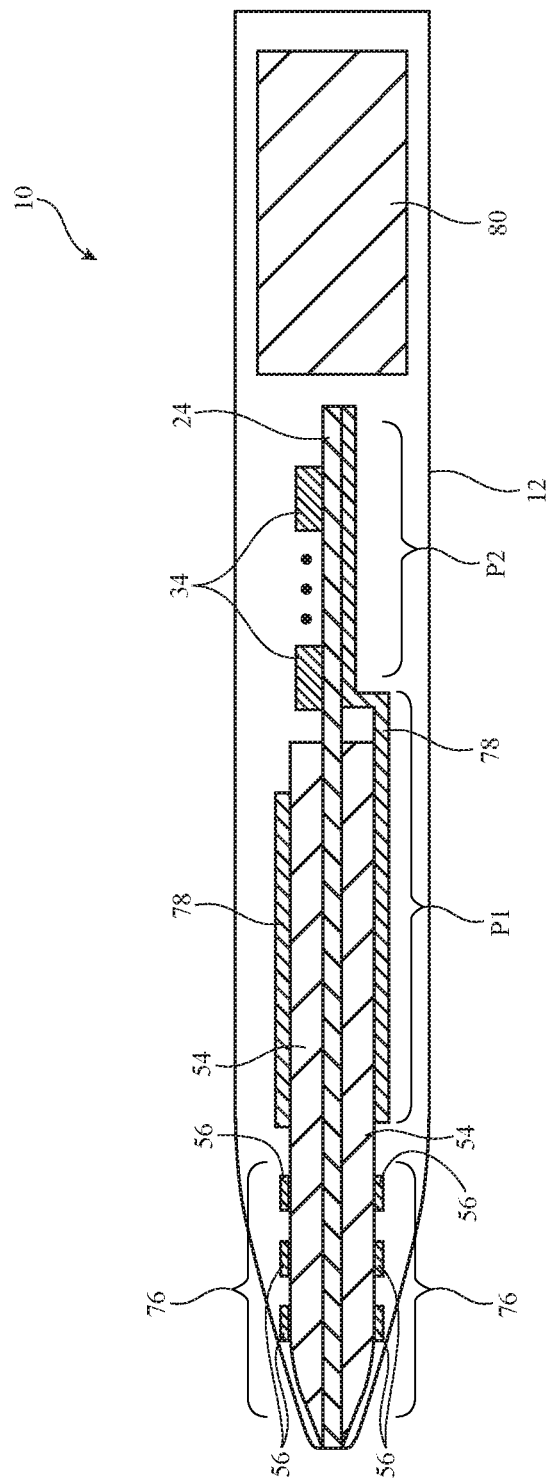
FIG. 15 is a cross-sectional side view of an illustrative electronic device that includes conductive structures of the type shown in FIG. 14 in accordance with an embodiment.

FIG. 15 is a cross-sectional side view of device 10 in an illustrative configuration in which device 10 serves as a stylus for providing pen input to a touch pad or touch screen display in a device with a display. As shown in FIG. 15, stylus 10 may have an elongated housing such as housing 12. Housing 12 may have the shape of a cylinder, a cylindrical shape with one or more flattened sides, a tube with flat sides, or other suitable shape. Components 80 (e.g., a battery, wireless circuitry including one or more antennas and radio-frequency transceiver circuitry, control circuitry 16 and/or input-output devices 18) may be enclosed in housing 12. Printed circuit board 24 may also be enclosed within housing 12. As shown in FIG. 15, printed circuit board 24 may be at least partly embedded within molded plastic 54. Support structure 78 may have the shape of a cylindrical tube or a hollow tube of other cross-sectional shape in region P1 and may have the shape of a flat open platform in region P2 (as examples). Components 34 may be mounted on printed circuit 24 in region P2 and elsewhere along the length of printed circuit 24. Plastic 54 may be molded over printed circuit 24 and in the interior of the tube portion of support structure 78. In tip region 76, circumferential metal traces (e.g., ring-shaped metal traces 56 that run around the circumference of plastic 54 as described in connection with FIG. 5) may be used to form one or more stylus electrodes. The stylus electrodes may include, for example, a tip electrode, a ground electrode, and a ring electrode and may be used for generating near-field electromagnetic signals that are detected by the touch sensor array in external equipment 20. Vias 58 may be used to electrically connect each ring-shaped electrode 56 to a respective metal trace 44 in printed circuit 24. The metal traces of printed circuit 24 may couple each electrode to electrode control circuitry implemented using components 34 or other circuitry in device 10.

Figure 16:
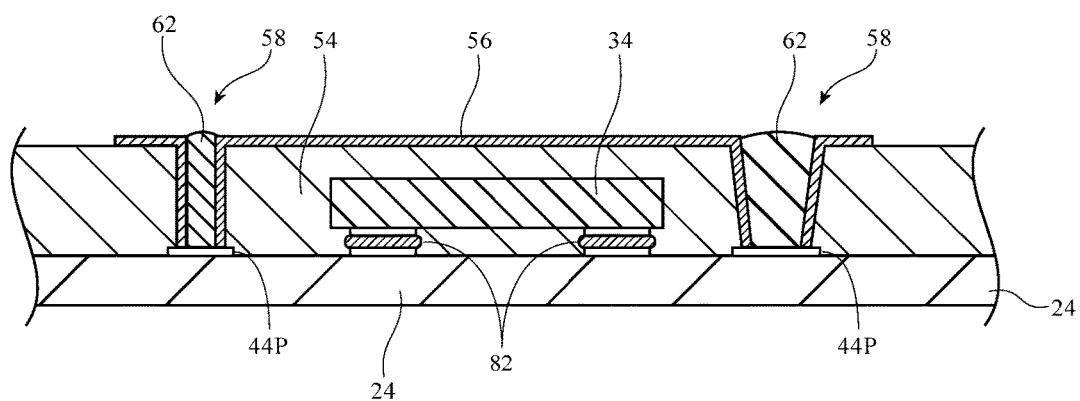
FIG. 16 is a cross-sectional side view of an illustrative electromagnetic shielding structure formed using via structures in accordance with an embodiment.

If desired, electromagnetic shielding structures may be formed using metal traces 56, vias 58, and plastic 54. As shown in FIG. 16, for example, components such as component 34 may mounted on printed circuit 34. For example, components such as components 34 may have contacts that mate with corresponding contacts on printed circuit 24. Solder 82 or other conductive material such as conductive adhesive may be used to couple each contact pad on component 34 to a corresponding contact formed from a metal trace on printed circuit 24. Plastic 54 may be molded over components such as component 34. Metal traces 56 on plastic 54 preferably include portions that overlap component 34 to provide electromagnetic shielding for component 34. Multiple components 34 may be shielded in this way, if desired. Via holes for vias 58 may be formed using mold pins, using laser drilling, using mechanical drilling, using etching, or using other suitable hole formation techniques. Metal traces 56 may extend into the via openings to short metal traces 56 to pads 44P on printed circuit 24. Pads 44P may be metal traces that form ground contacts or contacts that are maintained at other suitable voltage levels to allow metal traces 56 to serve as electromagnetic shielding for component 34. Vias 58 may be filled with conductive material 62 (e.g., in scenarios in which metal traces 56 in vias 58 do not completely fill vias 58). If desired, vias 58 may surround the periphery of component 34 to laterally shield component 34.

Figure 17:
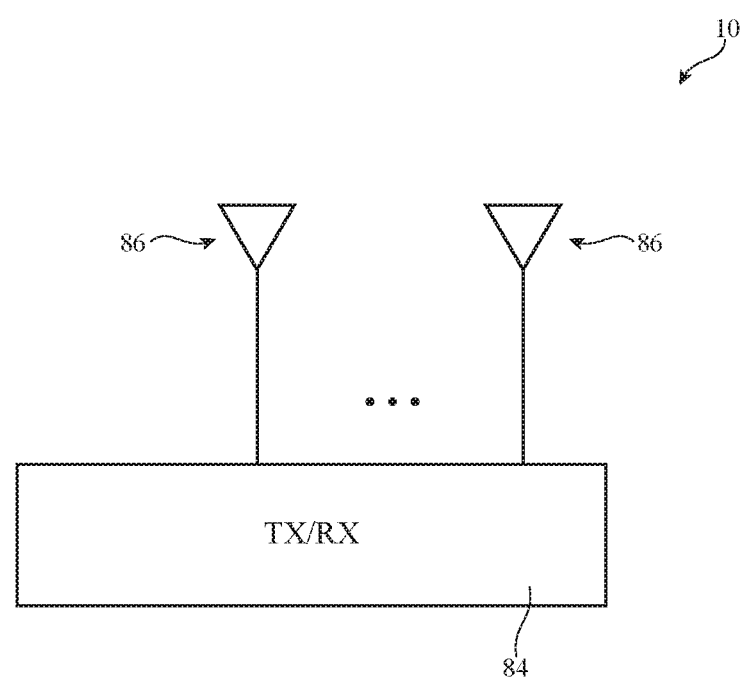
FIG. 17 is a schematic diagram of illustrative wireless circuitry in an electronic device in accordance with an embodiment.

As shown in FIG. 17, device 10 may contain one or more antennas 86. Antennas 86 may be inverted-F antennas, patch antennas, monopole antennas, dipole antennas, loop antennas, slot antennas, other types of antenna, or hybrid antennas based on one or more antenna structures such as these. There may be one antenna 86 in device 10 or may be two or more antennas in device 10. Radio-frequency transceiver circuitry 84 may be coupled to antenna(s) 86 using transmission line paths and can receive and/or transmit wireless signals using antenna(s) 86. For example, radio-frequency transceiver circuitry 84 may be used to transmit and/or receive cellular telephone signals, wireless local area network signals (e.g., IEEE 802.11 signals), Bluetooth® signals, etc.

Figure 18:
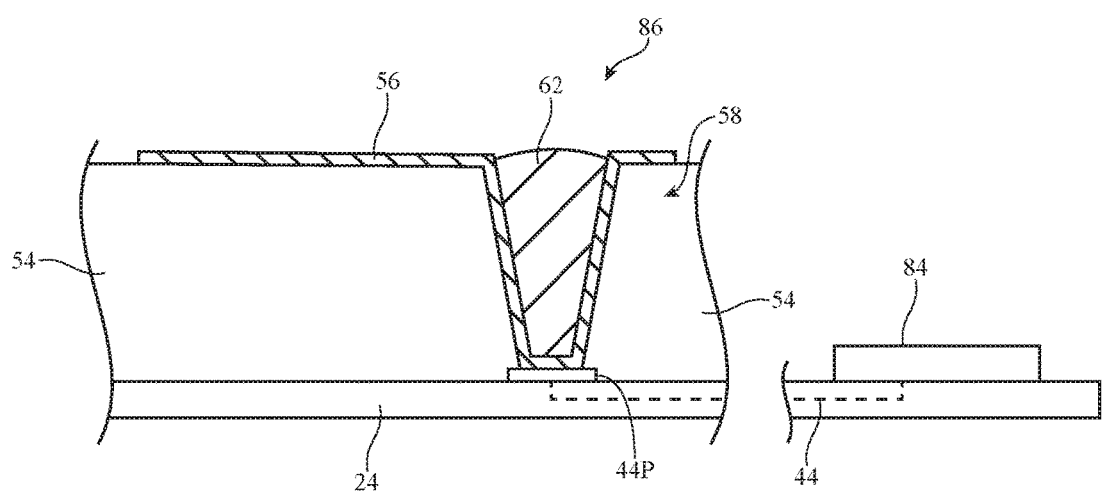
FIG. 18 is a cross-sectional side view of illustrative antenna structures that include a via structure in accordance with an embodiment.

As shown in FIG. 18, antenna structures such as structures associated with antenna 86 may be formed using molded plastic 54, printed circuit 24, metal traces 56, and vias such as via 58. Printed circuit 24 may include signal lines formed from metal traces 44. These signal lines may, for example form transmission lines that couple circuitry such as transceiver 84 to antenna 86. Antenna 86 may have a ground formed from metal traces 44 or other ground structures and a resonating element (or ground) formed from metal traces 56 on surface 60 of molded plastic 54. Via 58 may be formed from openings in plastic 54 (e.g., openings formed using mold pins, drilling, etc.), traces 56 that coat the interior surfaces of the via openings, and optional conductive via filling material 62 (e.g., solder, conductive adhesive, etc.).

If desired, other conductive structures may be formed using traces 56, vias 58, traces 44, and conductive components in device 10. Printed circuit 24 may also be used to support more than one type of conductive structure. As an example, device 10 may have a printed circuit with overmolded plastic that supports stylus electrodes for an active computer stylus, an antenna, and shielding structures. The conductive structures may be used in a computer stylus or any other electronic equipment.

The foregoing is merely illustrative and various modifications can be made by those skilled in the art without departing from the scope and spirit of the described embodiments. The foregoing embodiments may be implemented individually or in any combination.

What is claimed is:

1. Apparatus, comprising:
   an elongated printed circuit extending along a longitudinal axis;
   a contact pad formed from metal traces on the printed circuit;
   molded plastic on the printed circuit, wherein the molded plastic has an outer surface and an elongated cylindrical shape surrounding at least part of the elongated printed circuit and extending along the longitudinal axis, wherein the elongated cylindrical shape has a perimeter wrapping around the longitudinal axis;
   a metal trace on the outer surface that transmits data signals from the printed circuit and forms a ring-shaped electrode wrapping around the perimeter; and
   a via through the plastic electrically coupling the metal trace to the contact pad.

2. The apparatus defined in claim 1 wherein the outer surface has an activated region and wherein the metal trace on the outer surface comprises a plated metal trace on the activated region.

3. The apparatus defined in claim 2 wherein the activated region comprises a laser-activated region that is activated by exposure to laser light.

4. The apparatus defined in claim 1 wherein the via has an inner surface and wherein a metal trace is formed on the inner surface.

5. The apparatus defined in claim 4 further comprising a conductive material formed in the via on the metal trace that is on the inner surface.

6. The apparatus defined in claim 5 wherein the conductive material comprises solder.

7. The apparatus defined in claim 6 wherein the ring-shaped electrode comprises one of a plurality of ring-shaped electrodes on the outer surface at different respective positions along the longitudinal axis.

8. The apparatus defined in claim 6 wherein the metal trace on the outer surface is configured to form an antenna structure, the apparatus further comprising:
   radio-frequency transceiver circuitry on the printed circuit that is electrically coupled to the antenna structure.

9. The apparatus defined in claim 1 further comprising a hollow tube structure, wherein at least a portion of the molded plastic and the printed circuit board are located in the hollow tube structure.

10. The apparatus defined in claim 1 wherein the molded plastic comprises injection molded plastic formed using an injection molding tool with mold pins, wherein the via is formed from a hole in the injection molded plastic that is formed by the mold pins, and wherein the printed circuit is at least partly embedded within the molded plastic.

11. A method, comprising:
    forming a printed circuit having a surface with a metal pad;
    pressing against the metal pad with a mold pin in an injection molding tool to protect a portion of the metal pad;
    molding plastic over the printed circuit with the injection molding tool while the mold pin protects the portion of the metal pad and prevents the molded plastic from covering the protected portion of the metal pad;
    removing the mold pin to create a via hole; and
    forming metal traces on an outer surface of the molded plastic and along an inner surface of the via hole to electrically connect the metal traces on the outer surface to the metal pad.

12. The method defined in claim 11 wherein forming the metal traces comprises plating the metal traces onto the outer surface.

13. The method defined in claim 12 wherein the metal pad is a first of a pair of first and second aligned metal pads on opposing sides of the printed circuit, wherein the mold pin is a first of a pair of first and second mold pins, and wherein molding the plastic comprises molding the plastic while the first mold pin presses against the first metal pad and the second mold pin presses against the second metal pad in an opposing direction.

14. The method defined in claim 11 wherein at least part of the printed circuit is located in a tube and wherein molding the plastic comprises molding the plastic into the tube around the printed circuit.

15. The method defined in claim 11 wherein injection molding the plastic comprises forming a cylindrical plastic structure and wherein forming the metal traces on the outer surface of the molded plastic comprises forming a plurality of ring-shaped metal electrodes.

16. A stylus that provides input to touch sensors, comprising:
    an elongated printed circuit extending along a longitudinal axis and having metal traces;
    molded plastic covering the printed circuit, wherein the molded plastic has an outer surface and an elongated shape extending along the longitudinal axis;
    additional metal traces on the outer surface of the molded plastic; and
    a conductive structure interposed between the additional metal traces on the outer surface and the printed circuit coupling the additional metal traces on the outer surface to the metal traces of the printed circuit, wherein the additional metal traces on the outer surface overlap the printed circuit, and wherein the additional metal traces on the outer surface comprise circumferential electrodes that encircle the longitudinal axis and provide electromagnetic signals to the touch sensors.

17. The stylus defined in claim 16 wherein the conductive structure comprises:
    a metal member mounted on the metal traces of the printed circuit, wherein the metal member is located under a via hole in the molded plastic; and
    a metal coating extending from the additional metal traces on the outer surface along surfaces of the via hole to couple the additional metal traces on the outer surface to the metal member.

18. The stylus defined in claim 17 wherein the conductive structure further comprises conductive material in the via hole, wherein the conductive material in the via hole is a conductive material selected from the group consisting of: solder, metallic paint, and conductive adhesive.

19. The stylus defined in claim 16 wherein the conductive structure comprises a metal member mounted on the metal traces of the printed circuit, wherein the metal member has a portion extending through the outer surface and contacting the additional metal traces on the outer surface.

20. The stylus defined in claim 16 wherein the conductive structure comprises a conductive via extending through the molded plastic from the outer surface to the metal traces on the printed circuit.

* * * * *